United States Patent [19]

Sakai

[11] Patent Number: 5,600,101
[45] Date of Patent: Feb. 4, 1997

[54] MULTILAYER ELECTRONIC COMPONENT AND METHOD OF MANUFACTURING THE SAME

[75] Inventor: Norio Sakai, Moriyama, Japan

[73] Assignee: Murata Manufacturing Co., Ltd., Japan

[21] Appl. No.: 504,696

[22] Filed: Jul. 20, 1995

[30] Foreign Application Priority Data

Jul. 21, 1994 [JP] Japan .................................. 6-169646

[51] Int. Cl.⁶ ........................................................ H05K 1/14
[52] U.S. Cl. .......................... 174/261; 174/264; 174/262; 361/767; 257/698; 257/774; 29/849; 29/852
[58] Field of Search .................................... 361/767, 777, 361/778, 779; 174/261, 255, 262, 264, 265, 266; 257/698, 774; 439/75, 59; 29/842, 845, 852, 883, 874

[56] References Cited

U.S. PATENT DOCUMENTS

| 3,185,947 | 5/1965 | Freymodsson | 336/200 |
|---|---|---|---|
| 3,964,087 | 6/1976 | Mallon | 338/306 |
| 4,400,762 | 8/1983 | Bartley et al. | 361/402 |
| 4,437,141 | 3/1984 | Prokop | 361/403 |
| 4,821,007 | 4/1989 | Fields et al. | 333/238 |
| 4,907,128 | 3/1990 | Solomon et al. | 361/412 |
| 4,956,694 | 9/1990 | Edie | 357/74 |
| 5,060,369 | 10/1991 | Date | 29/830 |
| 5,140,745 | 8/1992 | McKenzie, Jr. | 29/852 |
| 5,276,963 | 1/1994 | Flanders | 29/852 |
| 5,383,095 | 1/1995 | Korsunsky et al. | 361/785 |
| 5,386,087 | 1/1995 | Lee et al. | 174/261 |
| 5,471,368 | 11/1995 | Downie et al. | 361/760 |
| 5,486,657 | 1/1996 | Bell et al. | 174/261 |

FOREIGN PATENT DOCUMENTS 696992 4/1994 Japan .

Primary Examiner—Laura Thomas
Attorney, Agent, or Firm—Ostrolenk, Faber, Gerb & Soffen, LLP

[57] ABSTRACT

A multilayer electronic component has a substrate having a major surface with an area which can be utilized for mounting another electronic component thereon, and external electrodes arranged with a small pitch. According to a method of manufacturing multilayer electronic components, the external electrodes can be easily formed, and the characteristics of respective multilayer electronic components in the parent laminate can be measured during manufacture.

The parent laminate is formed by stacking a plurality of insulating sheets provided with via holes each having a conductor and internal circuits connected to the conductors. V-shaped slits are formed in one of the major surfaces of the parent laminate to divide the via holes and the conductors respectively filled in the via holes and expose the conductors within the slits. The exposed conductors respectively serve as the external electrodes of each of the multilayer electronic components obtained by cutting the parent laminate.

12 Claims, 5 Drawing Sheets

MULTILAYER ELECTRONIC COMPONENT AND METHOD OF MANUFACTURING THE SAME

BACKGROUND OF THE INVENTION

1. Field of the Invention

The present invention relates to a multilayer electronic component which can be contained in an electronic device, and particularly to a multilayer electronic component which constitutes a module for communication with moving objects, a semiconductor package, a hybrid IC, etc.

2. Description of the Related Art

The construction of conventional multilayer electronic components will be described with reference to FIGS. 7, 8 and 9.

Referring to FIG. 7, a multilayer electronic component 51 comprises a substrate 52 and external electrodes 53 which are formed on each of the side surfaces 52a and 52b of the substrate 52. The substrate 52 is formed by stacking a plurality of insulating sheets, including insulating sheets (not shown) provided with internal circuits (not shown), to form a parent laminate (not shown), cutting the parent laminate in accordance with the dimensions of the substrate 52, and then firing the substrate. The external electrodes 53 are formed by applying a conductor to each of the side surfaces in the direction of thickness thereof. In such a multilayer electronic component 51, when a conductor is applied to each of the side surfaces 52a and 52b of the substrate 52, the conductor inevitably adheres to both major surfaces 52c of the substrate 52, thereby forming two ends 53a of each of the external electrodes 53 on the two major surfaces 52c of the substrate 52, respectively.

Referring to FIG. 8, a multilayer electronic component 61 comprises a substrate 62 and external electrodes 64 which are respectively provided in indentations 63 formed in each of the side surfaces 62a and 62b of the substrate 62. The substrate 62 is formed by stacking a plurality of insulating sheets, including insulating sheets (not shown) provided with internal circuits (not shown), and through holes 66, to form a parent laminate 65, applying a conductor to the inner peripheral surface of each of through holes 66 formed in the parent laminate 65, cutting the parent laminate 65 in accordance with the dimensions of the substrate 62, and then firing it. When the parent laminate 65 is cut, the through holes 66 are cut to form the indentations 63, and the exposed conductors in the indentations 63 respectively serve as the outer electrodes 64. In such a multilayer electronic component 61, when a conductor is applied to the inner peripheral surface of each of the through holes 66, the conductor inevitably adheres to the periphery of the opening of each of the through holes 66. Consequently, exposed ends 64a of each of the external electrodes 64 are formed around the peripheries of both ends 63a of each indentation 63 on both major surfaces of the substrate 62.

FIG. 9 shows the multilayer electronic component disclosed in Japanese Patent Laid-Open No. 6-96992 (Laid-Open Date: Apr. 8, 1994). As shown in FIG. 9, a mother laminate 74 formed by stacking a plurality of insulating sheets with conductor films 83 and 84 interposed therein comprises via holes 79 respectively filled with conductors 78 and placed along grooves 80 for cutting the mother laminate 74 into respective multilayer electronic components. The conductors 78 respectively serve as external electrodes 72 of each of the multilayer electronic components obtained by cutting the mother laminate 74 along the grooves 80. In FIG. 9, reference numerals 81 and 82 denote slits which are respectively provided, along the grooves 80, at the bottoms of the grooves 80 of the mother laminate 74.

However, in the multilayer electronic component 51 shown in FIG. 7, since the external electrodes 53 are formed by applying a conductor, in some cases, the shapes of the ends 53a of the respective external electrodes 53 provided on both major surfaces 52c of the substrate 52 are not constant, and the dimensions thereof are greater than desired predetermined dimensions. When another electronic component is mounted on the substrate 52, therefore, the area where such electronic component can be mounted is limited, and it is also difficult to decrease the arrangement pitch (spacing) of the external electrodes 53. Further, since metallic paste must be applied to each of the side surfaces 52a and 52b of the substrate 52 for forming the external electrodes 53, much time is required for that work.

In the multilayer electronic component 61 shown in FIG. 8, as in the multilayer electronic component 51, in some cases, the shapes of the ends 64a of the respective external electrodes 64 provided on both major surfaces 64c of the substrate 62 are not constant, and the dimensions thereof are greater than desired predetermined dimensions. When another electronic component is mounted on the substrate 62, the area where such an electronic component can be mounted is restricted, and it is also difficult to decrease the arrangement pitch of the external electrodes 64. Although the through holes are formed by using a drill, moreover, it is also difficult to decrease the diameter thereof to less than a predetermined value, for example, 0.3 mm, thereby imposing a further restriction on the arrangement pitch of the external electrodes 64.

The characteristics of both multilayer electronic components 51 and 61 must be measured at least before shipment to the customer. However, in principle, such characteristics cannot be measured unless the multilayer electronic components are formed into chips which are functionally independent of each other. Namely, the characteristics of the multilayer electronic component 51 cannot be measured unless the external electrodes 53 are formed by applying metallic paste to the substrate 52. On the other hand, the characteristics of the multilayer electronic component 61 cannot be measured unless the external electrodes 64 are formed by cutting the parent laminate 65 to cut the through holes 66.

The multilayer electronic component shown in FIG. 9 is improved in the above respects. However, this electronic component also has a practical problem to be solved, namely that since the opposite inner walls of each of the grooves 80 are parallel with each other, it is necessary to either prepare a special measurement jig or to use a processing method which provides a sufficient groove width, in order to measure the characteristics of the respective multilayer electronic components while they are still in the form of the parent substrate, without the measurement jig producing short circuits.

SUMMARY OF THE INVENTION

Accordingly, a broad object of the present invention is to provide a multilayer electronic component in which a major surface of a substrate can have another electronic component mounted thereon, and in which the arrangement pitch of its external electrodes can be decreased.

Another object of the present invention is to provide a method of manufacturing multilayer electronic components by which external electrodes can be easily formed and by which the characteristics of each multilayer electronic component in a parent substrate can be easily measured during manufacture.

In order to achieve these and other objects, in accordance with an embodiment of the present invention, a multilayer electronic component comprises a substrate which is formed by stacking a plurality of insulating sheets including an insulating sheet provided with an internal circuit, and which has major surfaces and side surfaces; and external electrodes which are formed by applying a conductor to inclined portions respectively formed in the side surfaces of said substrate.

In one embodiment of the multilayer electronic component, both ends of each of the external electrodes are provided on the inclined portions.

In accordance with another embodiment of the invention, one of the ends of each of the external electrodes is provided on one of the major surfaces of the substrate, the other end being provided on the inclined portion of the substrate.

In accordance with still another embodiment of the invention, the external electrodes are respectively formed by applying a conductor to indentations formed in the inclined portions.

In accordance with a further embodiment of the present invention, a method of manufacturing multilayer electronic components comprises the steps of forming a parent laminate by stacking a plurality of insulating sheets including insulating sheets provided with via holes each having a conductor and internal circuits connected to the conductors, cutting V-shaped slits in the parent laminate so as to cut the via holes and the conductors to expose the conductors within the slits, and forming cutting planes which are respectively continuous with the slits to cut the parent laminate.

In the manufacturing method, the via holes may be filled with the conductors.

In accordance with another embodiment of the invention, the conductors may be applied to the inner peripheral surfaces of the via holes.

Since the multilayer electronic component according to the present invention comprises external electrodes formed by applying the conductors to the via holes, when the ends of the respective external electrodes are provided on one of the major surfaces of the substrate, the shape and dimensions of the ends of the respective external electrodes are constant because the shape and dimensions are determined by the shape and dimensions of the via holes.

By the method of manufacturing multilayer electronic components according to the present invention the external electrodes can be simply formed, by forming the slits in the parent laminate to expose the conductors previously applied to the via holes.

Further, since V-shaped slits are formed to divide the conductors previously applied to the via holes, the external electrodes of the respective multilayer electronic components can be made functionally independent of each other, with a sufficient space therebetween to permit measurement of the electrical characteristics.

Other features and advantages of the present invention will become apparent from the following description of the invention which refers to the accompanying drawings.

DETAILED DESCRIPTION OF EMBODIMENTS OF THE INVENTION

The construction of a multilayer electronic component in accordance with an embodiment of the present invention is described with reference to FIG. 1.

Figure 1:
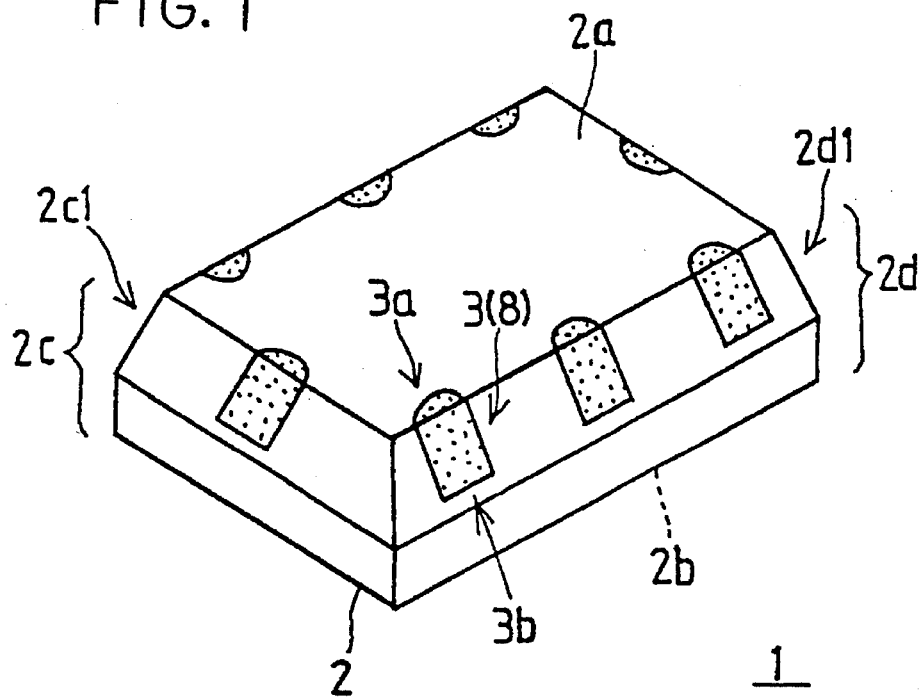
FIG. 1 is a perspective view showing a multilayer electronic component in accordance with an embodiment of the present invention.
Figure 9:
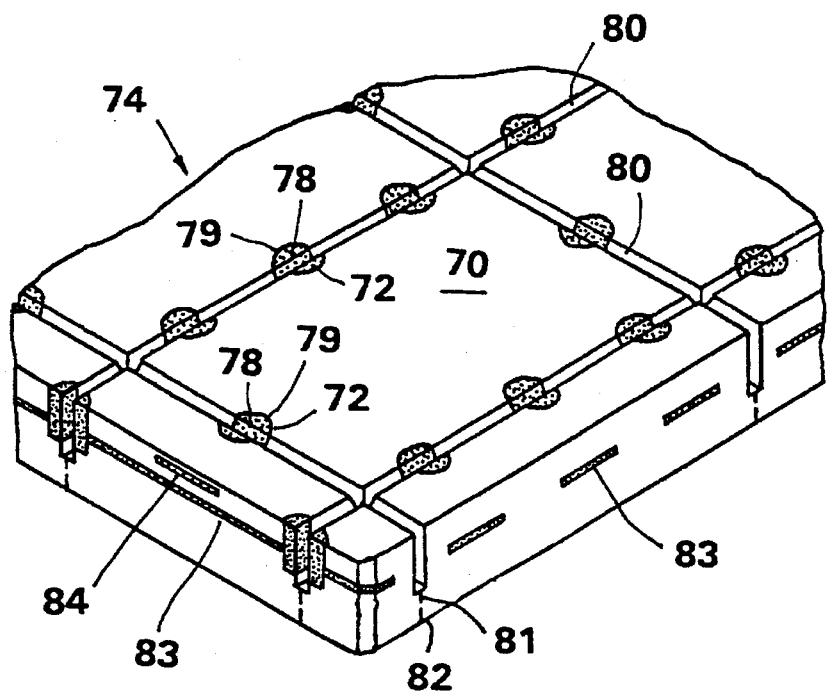
FIG. 9 is a perspective view showing still another conventional multilayer electronic component in the form of a parent substrate.

In FIG. 1, reference numeral 1 denotes a multilayer electronic component comprising a substrate 2. The substrate 2 has opposite major surfaces 2a and 2b, a pair of opposite side surfaces 2c and another pair of opposite side surfaces 2d, inclined portions 2c1 and 2d1 being formed on the sides 2c and 2d, respectively, so as to extend toward one of the major surfaces 2a. External electrodes 3 connected to internal circuits are formed in each of the inclined surfaces 2c1 and 2d1. One end 3a of each of the external electrodes 3 is provided on the major surface 2a of the substrate 2, the other end 3b being provided on the inclined surface 2c1 or 2d1.

A method of manufacturing multilayer electronic components in accordance with this embodiment of the present invention is described with reference to FIGS. 2 and 3.

Figure 2:
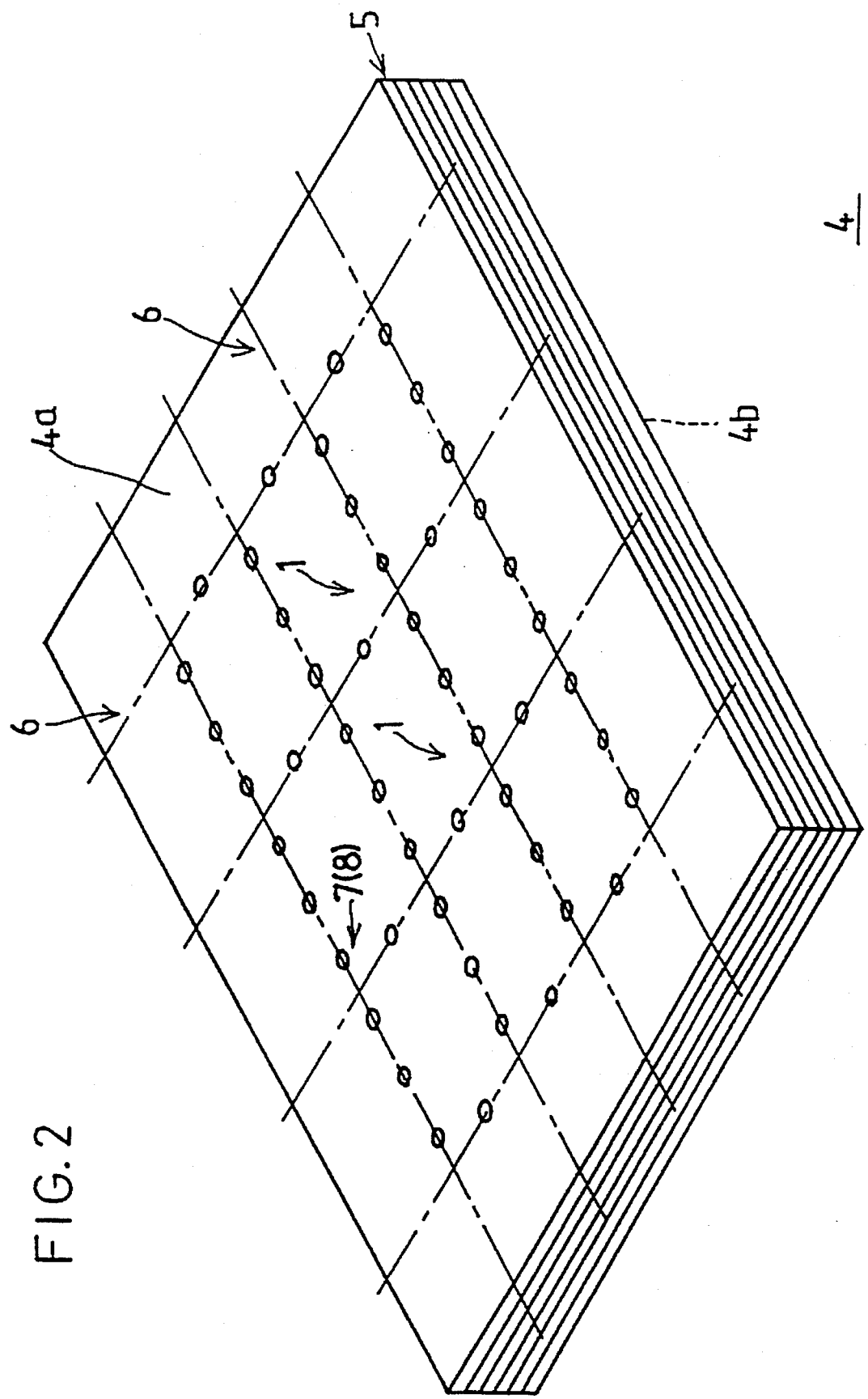
FIG. 2 is a perspective view showing a parent laminate used for manufacturing the multilayer electronic component shown in FIG. 1.

The parent laminate 4 shown in FIG. 2 is first prepared. The parent laminate 4 is formed by stacking a plurality of insulating sheets 5, for example, made of ceramic. Before the insulating sheets 5 are stacked, via holes 7 are formed in the sheets 5 in an upper portion shown in FIG. 2 along cutting lines 6. Also before the insulating sheets 5 are stacked, internal circuits (not shown) for the respective multilayer electronic components 1 to be later obtained by dividing the parent laminate 4 along the cutting lines 6, are formed by printing conductor films and resistor films on the insulating sheets. The via holes 7 are respectively filled with conductors 8 which are connected to the internal circuits. The via holes 7 formed in the respective insulating sheets 5, and the conductors 8 which are respectively filled in the via holes 7, are continuous along the direction of lamination of the insulating sheets 5, the conductors 8 being respectively exposed from the openings of the via holes 7 on the major surface 4a of the parent laminate 4. The conductors 8 are usually formed in the via holes 7 before the insulating sheets are stacked, but may also be formed or filled after stacking.

Figure 3:
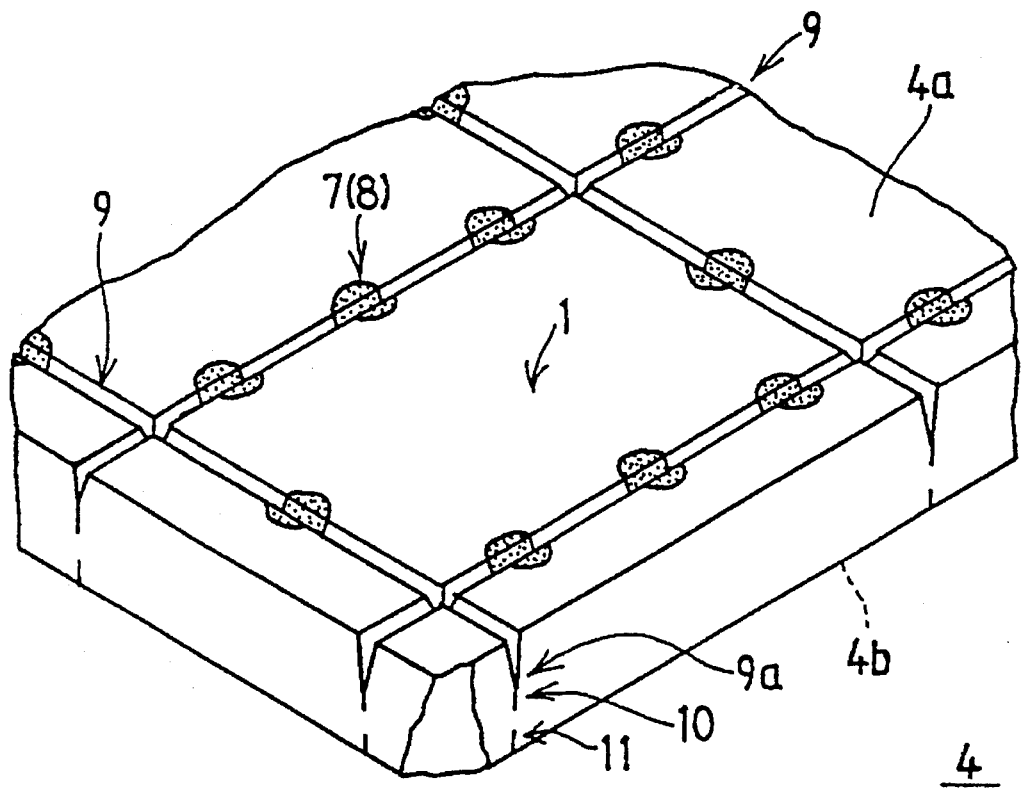
FIG. 3 is an enlarged perspective view showing a principal portion of the parent laminate shown in FIG. 2 with the slits formed therein.

V-shaped slits 9 are then formed in the major surface 4a of the parent laminate 4 along the cutting lines 6 shown in FIG. 2, for example, by using a dicing saw, to divide the via holes 7 and the conductors 8 filled in the via holes 7 along the direction of the thickness of the parent laminate 4 and to expose the conductors 8 within the slits 9, as shown in FIG. 3. The use of the dicing saw can directly form the V-shaped slits. The formation of such slits 9 causes the formation of the inclined portions 2c1 and 2d1 of the side surfaces 2c and 2d, respectively, of the substrate 2, which constitutes the multilayer electronic component 1 shown in FIG. 1. The exposed conductors 8 within the slits 9 respectively serve as the external electrodes 3. The parent laminate 4 is then fired. Since the conductors 8 are divided by forming the slits 9, the respective multilayer electronic components 1, and particularly the external electrodes 3 thereof, are functionally independent of each other with a sufficient spacing therebetween. The characteristics of each of the multilayer electronic components can thus be measured through the conductors 8 (the external electrodes 3) exposed within the slits 9 while they are still in the form of the parent laminate 4 after firing. The multilayer electronic components may then be shipped to the customer while still in the state of the parent laminate 4 after firing.

In the final stage, the parent laminate 4 is cut along cutting planes which are respectively continuations of the slits 9, into a plurality of multilayer electronic components 1 which are functionally independent of each other. It is preferable for facilitating division of the parent laminate 4 to provide respective notches 10 and 11 at the bottoms 9a of the slits 9 and the other major surface 4b of the parent laminate 4. Either of the notches 10 and 11 may be omitted.

As described above, the multilayer electronic component 1 according to the present invention comprises the external electrodes 3 formed by respectively filling the via holes 7 with the conductors 8, so that the shape and dimensions of the ends 3a of the external electrodes 3 provided on the major surface 2a of the substrate 2 are constant because the shape and dimensions are determined by the shape and dimensions of the via holes 7. Since the via holes 7 are formed in each of the insulating sheets 5, via holes having a relatively small diameter can be formed by punching without using a drill.

In the multilayer electronic component 1, therefore, the arrangement pitch of the external electrodes 3 can be decreased, and a greater portion of the major surface 2a of the substrate 2 can be used for mounting another electronic component thereon, as compared with a convention component with external electrodes formed by applying a conductor to the side surfaces of a substrate. Further, since neither of the ends 3a and 3b of the external electrodes 3 is provided on the other major surface 2b of the substrate 2, the whole surface 2b can be employed for mounting another electronic component thereon.

Since the method of manufacturing multilayer electronic components according to the present invention comprises forming the V-shaped slits 9, to expose the conductors 8 previously filled in the via holes 7, the work of forming the external electrodes is simpler than the work of forming conventional external electrodes by applying a conductor to the sides of the substrate.

And since the V-shaped slits 9 divide the parent laminate 4 into multilayer electronic parts 1 which can be made functionally independent of each other, it is possible to easily and efficiently measure the characteristics of the respective multilayer electronic components 1 while they are still in the form of the parent laminate 4, after firing.

Figure 4:
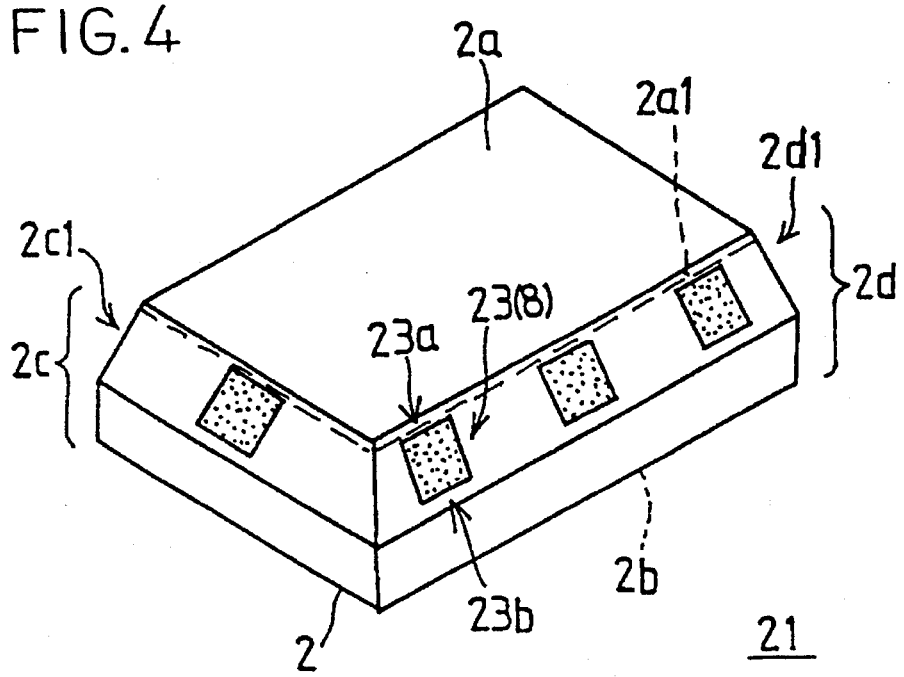
FIG. 4 is a perspective view showing a multilayer electronic component in accordance with a second embodiment of the present invention.

A second embodiment of the invention is shown in FIG. 4. Although, in the multilayer electronic component 1 of the first embodiment, one end 3a of each external electrode 3 is provided on the major surface 2a of the substrate 2, it is also possible for both ends of the external electrodes to be provided in the inclined portions 2c1 and 2d1 of the substrate 2. Examples are the ends 23a and 23b of the external electrodes 23 in the multilayer electronic component 21 shown in FIG. 4. Such external electrodes 23 are formed by forming the via holes 7 in the parent laminate 4, respectively filling the via holes 7 with the conductors 8, stacking another insulating sheet 2a1 on the top surface of the parent laminate 4, providing the slits 9 in the parent laminate 4, firing the parent laminate 4 and then dividing the parent laminate 4. The multilayer electronic component 21 constructed as described above enables both major surfaces 2a and 2b of the substrate 2 to be entirely used for mounting another electronic component thereon.

The external electrodes 3 shown in FIG. 1 and the external electrodes 23 shown in FIG. 4 may be mixed in a single multilayer electronic component as required. Also, the external electrodes 3 shown in FIG. 1 can be mixed with external electrodes formed by, for example, applying a conductor to the side surfaces 2c and 2d of the substrate 2, in a single multilayer electronic component.

Figure 5:
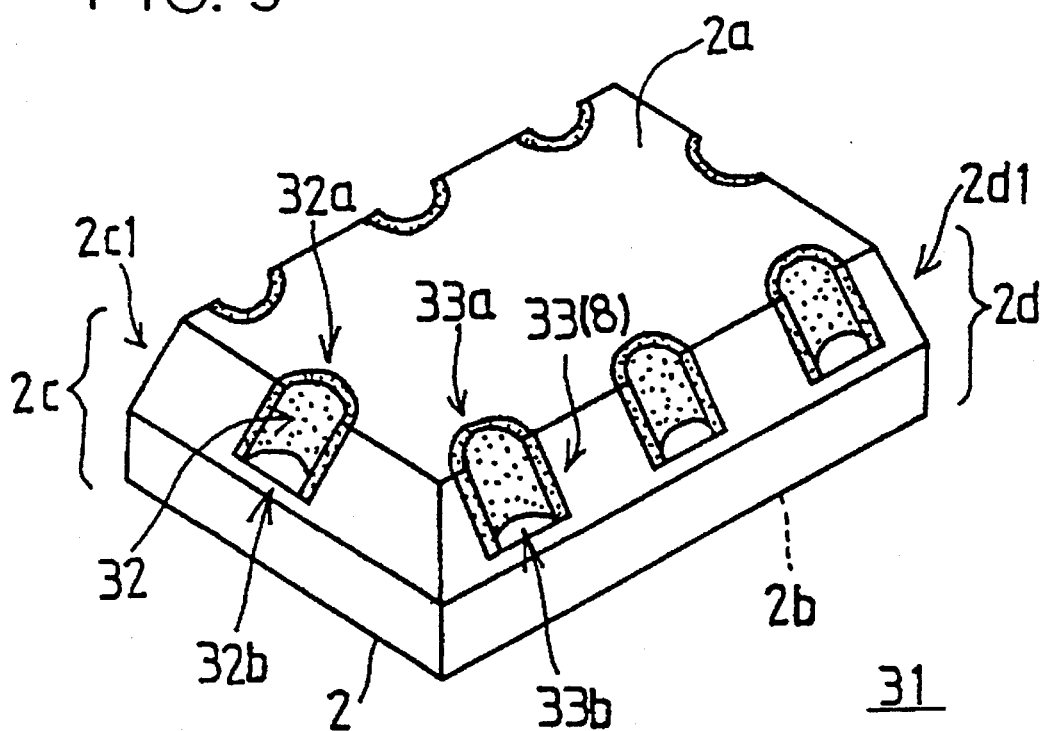
FIG. 5 is a perspective view showing a multilayer electronic component in accordance with a third embodiment of the present invention.

In a third embodiment of the invention, shown in FIG. 5, a multilayer electronic component 31 is formed in which external electrodes are formed by applying a conductor to the inner surfaces of indentations 32 which are formed in the inclined portions 2c1 and 2d1 of the side surfaces 2c and 2d, respectively, of the substrate 2. In this case, the ends 32a and 33a of the indentations 32 and the external electrodes 33 are provided on the major surface 2a of the substrate 2, the other ends 32b and 33b being provided in the inclined portions 2c1 and 2d1 of the substrate 2. The multilayer electronic component 31 is formed by applying the conductors 8 to the inner peripheral surfaces of the respective via holes 7 provided in the insulating sheets 5 shown in FIG. 2, forming the parent laminate 4 by stacking the insulating sheets 5, providing the V-shaped slits to respectively expose the conductors 8 in the form of indentations along the inner peripheral surfaces of the via holes 7 within the slits 9, firing the parent laminate 4, and then cutting it. In the thus-formed multilayer electronic component 31, the amount of material in the conductors 8 used for forming the external electrodes 33 is smaller than that needed for forming the external electrodes by filling the via holes with the conductors, thereby decreasing the manufacturing cost.

In a multilayer electronic component comprising a substrate having indentations, as in the multilayer electronic component 31, both ends of the indentations and the external electrodes may be provided in the inclined portions of the substrate.

Figure 6:
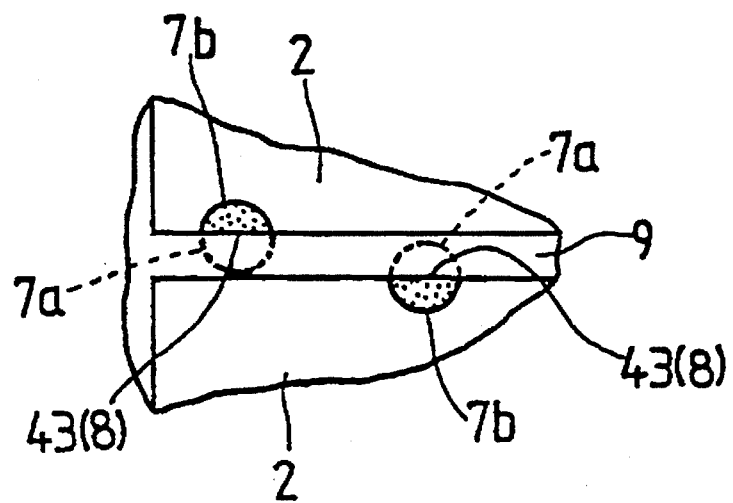
FIG. 6 is an enlarged plan view showing a principal portion of a multilayer electronic component in accordance with a fourth embodiment of the present invention.
Figure 7:
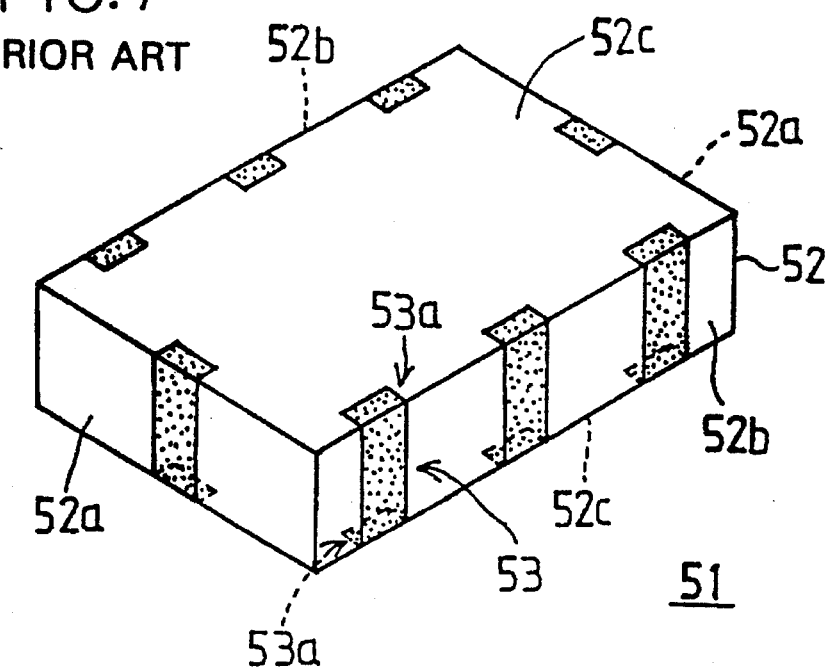
FIG. 7 is a perspective view showing a conventional multilayer electronic component.
Figure 8:
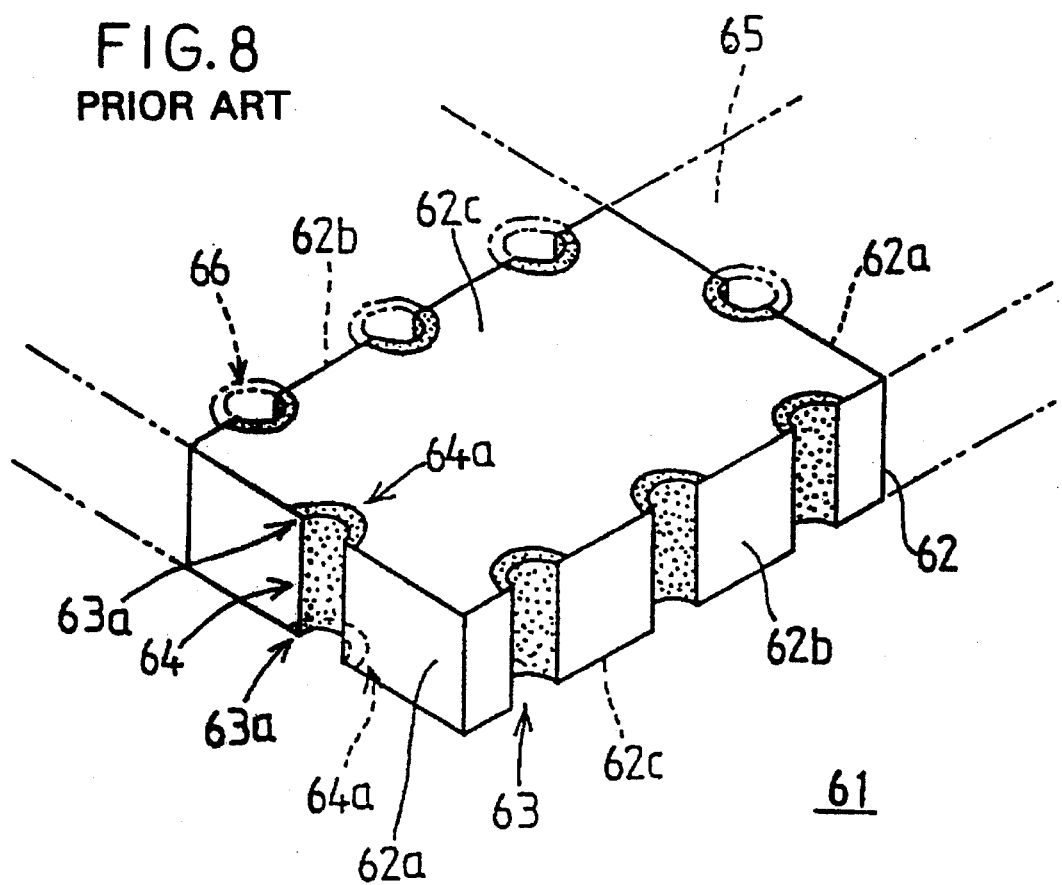
FIG. 8 is a perspective view showing another conventional multilayer electronic component.

A fourth embodiment of the invention is shown in FIG. 6. In the method of manufacturing multilayer electronic components according to the previous embodiments of present invention, the conductor 8 is filled in each of the via holes 7 and then divided to form two external electrodes 3 for two multilayer electronic parts 1. In the fourth embodiment, the width of the slits 9 is substantially equal to the diameter of the via holes 7. Thus, external electrodes 43 may be formed by forming slits 9 to entirely cut off the conductive material in halves 7a of the respective via holes 7 and to expose the conductive material remaining in the other halves 7b, as shown in FIG. 6.

Although, in the above embodiments of the present invention, the via holes 7 filled with the conductors 8 have a circular form, the via holes may also have another form, such as a rectangular form.

In the multilayer electronic component according to the present invention, since the external electrodes respectively comprise the conductors applied to the via holes, the shapes and dimensions of the ends of the external electrodes, which are provided on one of the major surfaces of the substrate, are constant because the shapes and dimensions are determined by the shapes and dimensions of the openings of the via holes. Since the via holes are formed in each of the insulating sheets before stacking, via holes having a relatively small diameter can be formed by punching without using a drill. As a result, the arrangement pitch of the external electrodes can be decreased, and a greater portion of each major surface of the substrate can be used for mounting another electronic component thereon, as compared with external electrodes formed by applying a conductor to the sides of a substrate, thereby permitting the mounting density of the components to be increased. Further, since no ends of the external electrodes are provided on the other major surface of the substrate, the entirety of the other major surface can be employed for mounting another electronic component, and a further increase in the mounting density of the components can thus be realized.

In the method of manufacturing multilayer electronic components according to the present invention external electrodes are formed by forming slits in a parent laminate to expose the conductors previously applied to via holes within the slits, thereby simplifying the work of forming the external electrodes.

Further, the V-shaped slits divide the conductors previously filled in via holes, so that the external electrodes of respective multilayer electronic components can be made functionally independent of each other with a sufficient spacing therebetween. It is thus possible to easily and efficiently measure the characteristics of the respective multilayer electronic components while still in the form of the parent laminate after firing. After measurement of the characteristics, the parent laminate may be shipped to the customer. This facilitates handling of the multilayer components, such as packaging, etc., as compared with multilayer electronic components in the form of chips. A plurality of multilayer electronic components can be obtained by simply cutting the parent laminate after shipment to the customer, thereby enabling efficient mounting of the multilayer electronic components.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A multilayer electronic component comprising:

a substrate having major and side surfaces and comprising a plurality of stacked insulating sheets including an insulating sheet provided with an internal circuit; and an external electrode comprising a conductor applied to an inclined portion formed in said side surface of said substrate and connected to said internal circuit.

2. A multilayer electronic component according to claim 1, wherein said inclined portion has an indentation formed therein, and said external electrode comprises a conductor applied to said indentation.

3. A multilayer electronic component according to claim 1, wherein said electrode has two ends and both ends of said external electrode are in said inclined portion of said substrate.

4. A multilayer electronic component according to claim 3, wherein said inclined portion has an indentation formed therein, and said external electrode comprises a conductor applied to said indentation.

5. A multilayer electronic component according to claim 1, wherein said electrode has two ends and one end of said external electrode is on one of said major surfaces of said substrate, the other end being in said inclined portion of said substrate.

6. A multilayer electronic component according to claim 5, wherein said inclined portion has an indentation formed therein, and said external electrode comprises a conductor applied to said indentation.

7. A method of manufacturing a multilayer electronic component using a parent laminate formed by stacking a plurality of insulating sheets, including an insulating sheet provided with via holes and an internal circuit, said via holes having respective conductors connected to said internal circuit, said method comprising the steps of:

forming a slit which is V-shaped in cross-sectional form in one major surface of said parent laminate to divide said via holes and said conductors and thereby expose said conductors within said slit; and forming a cutting plane continued from said slit to divide said parent laminate and thereby form said component.

8. A method of manufacturing a multilayer electronic component according to claim 7, wherein said conductors comprise conductive material filled into said via holes.

9. A method of manufacturing a multilayer electronic component according to claim 7, wherein said conductors are films of conductive material respectively formed on inner peripheral surfaces of said via holes.

10. A method of manufacturing a multilayer electronic component using a parent laminate formed by stacking a plurality of insulating sheets including an insulating sheet provided with an internal circuit and via holes, each via hole having a conductor connected to said internal circuit, said method comprising the steps of:

stacking at least one additional insulating sheet on one major surface of said laminate, said additional insulating sheet having no via holes or circuits;

forming a slit which is V-shaped in cross-sectional form in said one major surface of said parent laminate to divide said via holes and said conductors and thereby expose said conductors within said slit; and forming a cutting plane continued from said slit to divide said parent laminate and thereby form said component.

11. A method of manufacturing a multilayer electronic component according to claim 10, wherein said conductors comprise conductive material filled into said via holes.

12. A method of manufacturing a multilayer electronic component according to claim 10, wherein said conductors are films of conductive material respectively formed on inner peripheral surfaces of said via holes.

* * * * *